United States Patent
Hannah

(10) Patent No.: US 9,110,804 B2
(45) Date of Patent: Aug. 18, 2015

(54) ON-DIE ELECTRIC COSMIC RAY DETECTOR

(71) Applicant: Intel Corporation, Santa Clara, CA (US)

(72) Inventor: Eric C. Hannah, Pebble Beach, CA (US)

(73) Assignee: Intel Corporation, Santa Clara, CA (US)

( * ) Notice: Subject to any disclaimer, the term of this patent is extended or adjusted under 35 U.S.C. 154(b) by 52 days.

(21) Appl. No.: 13/681,832

(22) Filed: Nov. 20, 2012

(65) Prior Publication Data

US 2014/0138555 A1    May 22, 2014

(51) Int. Cl.
 *G01T 1/00* (2006.01)
 *G06F 11/07* (2006.01)
 *G01R 31/317* (2006.01)
 *G01R 31/3181* (2006.01)

(52) U.S. Cl.
 CPC .......... *G06F 11/0793* (2013.01); *G01R 31/317* (2013.01); *G01R 31/31816* (2013.01)

(58) Field of Classification Search
 CPC .......... G01R 31/317; G01R 38/31816
 USPC .......................................... 250/394
 See application file for complete search history.

(56) References Cited

U.S. PATENT DOCUMENTS

| 7,309,866 | B2 | 12/2007 | Hannah |
| 2004/0165418 | A1* | 8/2004 | Lesea ............................ 365/154 |
| 2005/0012045 | A1* | 1/2005 | Fifield et al. ............. 250/370.02 |
| 2006/0000980 | A1 | 1/2006 | Hannah |
| 2006/0235917 | A1 | 10/2006 | Manber |
| 2008/0016384 | A1 | 1/2008 | Smith et al. |
| 2009/0231771 | A1* | 9/2009 | Bransford et al. ........... 361/93.1 |

FOREIGN PATENT DOCUMENTS

JP    11-326526    11/1999

OTHER PUBLICATIONS

Notification of Transmittal of the International Search Report and the Written Opinion of the International Searching Authority issued for the PCT International Patent Application No. PCT/US2013/046620, mailed Apr. 8, 2014, 12 pages.

* cited by examiner

*Primary Examiner* — David Porta
*Assistant Examiner* — Edwin Gunberg
(74) *Attorney, Agent, or Firm* — Blakely, Sokoloff, Taylor & Zafman LLP

(57) ABSTRACT

Described is a chip comprising: a substrate; a logic unit forming an active circuit on the substrate; and a cosmic ray detector embedded in the substrate, the cosmic ray detector to detect a cosmic ray and to generate a signal indicating detection of the cosmic ray, the signal for reducing error in the logic unit.

14 Claims, 5 Drawing Sheets

ON-DIE ELECTRIC COSMIC RAY DETECTOR

BACKGROUND

Normal background radiation environment on the surface of the earth has ionizing components that sometimes affects the reliability of semiconductor integrated circuit chips, such as memory chips used in computers. If an intruding particle is near a p-n junction in the chip, it may induce a soft error, or single-event upset which can cause signals to change voltage and, accordingly, bits of data to change voltage value. Excess electron-hole pairs may be generated in the wake of the penetrating particle. The electric field in the neighborhood of the p-n junction, if sufficiently strong, separates these electrons and holes before they recombine, and sweeps the excess carriers of the appropriate sign to a nearby device contact. A random signal may be registered if this collected charge exceeds a critical threshold value.

Cosmic particles in the form of neutrons or protons can collide randomly with silicon nuclei in the chip and fragment some of them, producing alpha-particles and other secondary particles, including the recoiling nucleus. These alpha-particles and other secondary particles can travel in all directions with energies which can be quite high (though of course less than the incoming nucleon energy). Alpha-particle tracks so produced can sometimes extend a hundred microns through the silicon. The track of an ionizing particle may extend a fraction of a micron to many microns through the chip volume of interest, generating in its wake electron-hole pairs at a rate of one pair per 3.6-eV (electron-volts) loss of energy. A typical track might represent a million pairs of holes and electrons.

Shielding of devices, to protect from cosmic rays, may be impractical because it may require tens of meters of concrete to remove a cosmic ray. Additionally, a major contributor to soft errors is cosmic ray neutrons. Cosmic ray induced computer crashes have occurred and are expected to increase with frequency as devices (for example, transistors) decrease in size in chips. This problem is projected to become a major limiter of computer reliability in the next decade.

The contribution of random logic in processors is becoming dominant and no cost effective method of mitigation is known. Cache memories are already protected with ECC (error correction code), and logic arrays are relatively easy to protect with parity. Logic latches are very costly to protect as most methods use replication of logic to gain redundancy. Even an order of magnitude improvement in reliability may require a significant penalty in performance, power, area and cost.

Various approaches have been suggested to eliminate or reduce the number of soft errors due to cosmic ray interactions in chips. None of these approaches is completely successful, particularly as device size continues to decrease. Another approach is to accept that some soft errors will happen and to design memory and logic circuitry to include redundancy in all calculations. This approach involves more gates and enough spatial separation between contributing redundant elements to avoid mutual soft errors from the same cosmic ray. This approach is not practical for many chips.

BRIEF DESCRIPTION OF THE DRAWINGS

Embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
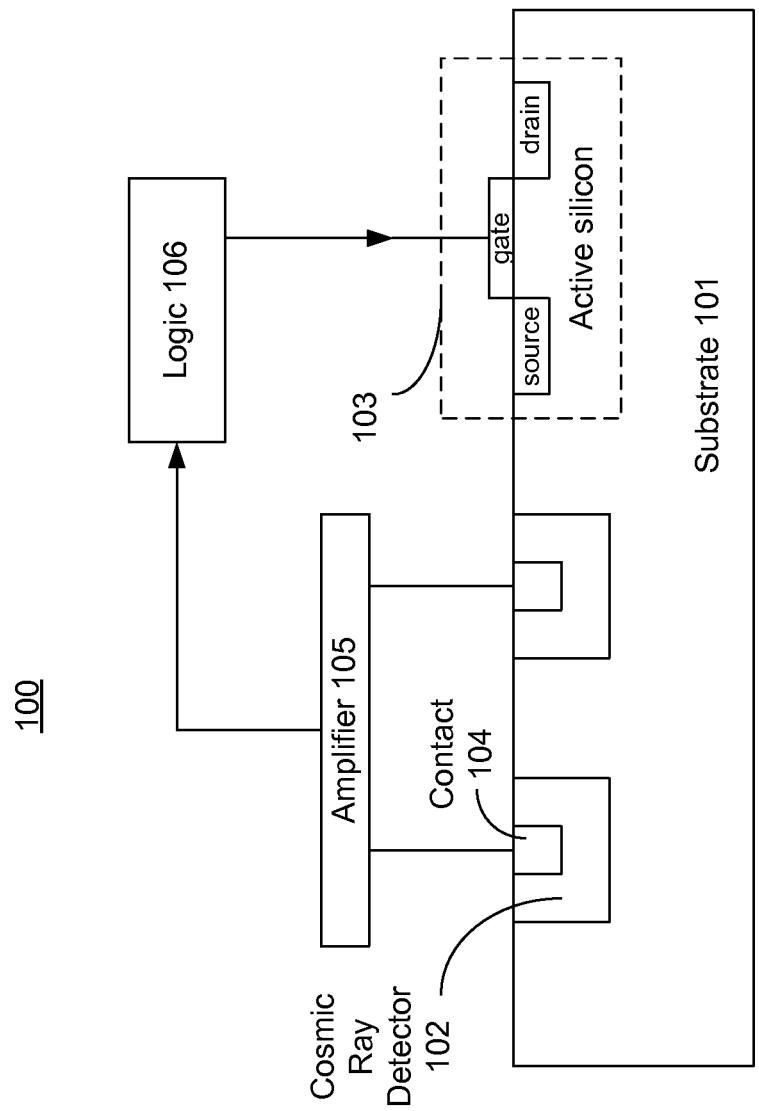
FIG. 1 is functional view of a substrate with embedded cosmic ray detectors and other logics to compensate for cosmic ray events, according to one embodiment of the disclosure.

Cosmic ray induced soft errors may cause electronic unreliability. The embodiments discuss an approach to detecting such cosmic ray events. In one embodiment, the approach comprises hardware apparatus to monitor the solid-state environment for direct signals from the cosmic ray induced ionization track, such as 10 picoseconds (ps) acoustic pulses, recombination light emission, and direct electrical detection.

The United State Department of Energy has documented that as many as 15 cosmic ray induced crashes occur each week for one of their supercomputing clusters. Such crashes are not just a problem for supercomputers; makers of FPGA's (field programmable logic gate arrays) and automotive engine controllers may have to grapple with this cosmic limiter of reliable electronics. As Moore's law continues to push device sizes downward, the sensitivity to cosmic ray disturbances will grow. This problem is projected to become a limiter of computer reliability in coming years.

Soft error rates for components and platforms grow geometrically worse with technology scaling. The term "scaling" generally refers to converting a design (schematic and layout) from one process technology to another process technology. The term "soft errors" generally refers to an error in a signal or datum that is wrong. For example, in the context of memory, soft error may change an instruction in a program or a data value read from memory. A soft error may flip a state of a memory cell without physically damaging the memory cell. Generally, soft errors do not damage the hardware, but damage the data associated with the hardware.

As the scale of technology reaches the molecular level, soft errors will be accompanied by hard errors. The term "hard errors" generally refers to radiation-induced damage, such as the displacement of atoms, which permanently produces errors in circuitry. Ionizing radiation breaks chemical bonds and damages precision nano-scale machinery. The embodiments disclose means (comprising cosmic ray detector and associated logic) for detecting and localizing a radiation strike. In one embodiment, the means discussed herein enable a complex system of assemblers to direct self-repair to the impacted site. In one embodiment, the cosmic ray detector discussed herein may be used in biological systems that have been augmented with nanotechnology agents.

The embodiments describe a practical on-chip (on-die) cosmic ray detector that detects high mobility electron/holes owing in the conduction band of the chip. Physical considerations show that a nuclear collision will result in an expanding, cooling tube of thermalized phonons, electrons, and holes, which over a short time, for example 10 ps, grows to a micron-scale volume.

In one embodiment, an on-chip cosmic ray detector at room temperature comprises an array of thin wires that detect the high mobility electrons/holes owing in the conduction band of the chip. In one embodiment, the wires are positioned close enough to sample secondary electrons/holes from a cosmic ray. In one embodiment, the array of wires or substrate contacts on a pitch of substantially 30 microns (μm) detect a cloud of charged particles, representing a typical profile of charge from a cosmic ray event. In such an embodiment, the array of wires or substrate contacts provide enough signal to noise (SNR) for an amplifier to detect a signal to provide an electrical signal indicating the cosmic ray event.

The profile of the charge from a cosmic ray event or the signal shape of a cosmic ray charged particle cloud is quite unique. In one embodiment, an additional signal detecting method comprising a matched filter on output of the amplifier is used to detect the cosmic ray event.

While the embodiments herein describe an array of wires for detecting cosmic ray event followed by a single amplifier to generate a signal indicating a cosmic ray event, other modifications are also within the scope of the embodiments. In one embodiment multiple amplifiers are paired with a group of wires for many detector wires detecting cosmic ray event. For example, a single transistor may be used to covering 1,000's of square microns of chip area with several groups of wires while in other embodiments many transistors may be used to better localize the cosmic ray strike region on the chip.

The technical effects of the embodiments discussed herein are many. Some non-limiting technical effects include fixing soft errors in the chip caused by a cosmic ray event without having to process corrupt data (i.e., data corrupted by the cosmic ray event). For example, in one embodiment by identifying the region of the chip that received a cosmic ray, the circuits in that region prone to error may be reset so that their outputs are deterministic. In another embodiment, all circuits in that region may be reset so that their outputs are deterministic. In another embodiment, an execution unit may re-start (or roll-back) execution of an instruction after a cosmic ray event is identified. In one embodiment, an interrupt may be generated to halt an executing instruction. In one embodiment, data held by a cache or memory may be refreshed after the amplifier indicates that a cosmic ray event has occurred.

The embodiments allow a chip to manage the cosmic ray event intelligently by distributing the cosmic ray detectors (array of wires) throughout the chip with logic (including amplifiers) coupled to the cosmic ray detectors to fix corrupted data or to warn the operating system (and/or other circuits) to take appropriate steps in response to knowing that a cosmic ray event occurred. Examples of appropriate steps include refreshing cache, resetting sequential logic units, restarting an instruction, etc.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected, or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a", "an", and "the" include plural references. The meaning of "in" includes "in" and "on." The terms "substantially," "close," "approximately," herein refer to being within +/−20% of a target value.

As used herein, unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the described embodiments, the transistors are metal oxide semiconductor (MOS) transistors, which include drain, source, gate, and bulk terminals. Source and drain terminals may be identical terminals and are interchangeably used herein. Those skilled in the art will appreciate that other transistors, for example, Bi-polar junction transistors—BJT PNP/NPN, BiCMOS, CMOS, eFET, etc., may be used without departing from the scope of the disclosure. The terms "MN" herein indicates an n-type transistor (e.g., NMOS, NPN BJT, etc) and the term "MP" indicates a p-type transistor (e.g., PMOS, PNP BJT, etc).

FIG. 1 is a chip (or processor) 100 of a substrate with embedded cosmic ray detectors and other logic units to compensate for cosmic ray events, according to one embodiment of the disclosure. In one embodiment, the chip 100 comprises a substrate 101, one or more of cosmic ray detectors 102, an amplifier 105, a logic unit 106, and an active region 103. The chip 100 may include chips made by any chip manufacturer, for example, Intel®, Samsung®, Apple®, Texas Instruments®, Google®, etc.

In one embodiment, one or more of cosmic ray detectors e.g., 102, are embedded in the substrate 101 and are positioned from one another to detect the cosmic ray in the strike region, the strike region being the region where the cosmic ray strikes. In one embodiment, the cosmic ray detectors are positioned at or within 1 μm$^2$ of each other. In one embodiment, the cosmic ray detector is substantially within 3 μm of length with 0.1 μm width or diameter, and positioned about 3 μm below a circuit level (e.g., 103). In other embodiments other dimensions and positioning may be used to distribute the cosmic ray detectors within the chip 100.

In one embodiment, cosmic ray detector 102 comprises a contact 104 to provide an interface to other logic units to the cosmic ray detector 102. In one embodiment, contact 104 is a highly doped region of silicon to create a PN junction with the substrate well. In one embodiment, contact 104 is a metal contact to create a Schottky diode. In one embodiment, contact 104 is a silicide compound to create a low-resistance conducting contact to the bulk silicon well. In one embodiment, amplifier 105 is coupled to the cosmic ray detector 102 to monitor current/charge activity in the cosmic ray detector 102. In one embodiment, amplifier 105 is a single transistor with its gate terminal coupled to the contact 104, and with its source/drain terminals received by other logic. In one embodiment, amplifier 105 is a comparator that is coupled to the contact 104 at one of its input terminals and a reference signal at another of its input terminals. In other embodiments, other forms and architectures for the amplifier 105 may be used to monitor the output of the cosmic ray detector 102.

In one embodiment, the output of amplifier 105 indicates whether a cosmic ray event has occurred. In one embodiment, the output of amplifier 105 is received by a logic unit 106. In one embodiment, logic unit 106 communicates with the operating system (OS) informing the OS of the cosmic ray event so that the OS may take appropriate steps to address the cosmic ray event.

Examples of appropriate steps include informing the user of the processor that a cosmic ray event occurred along with information about where in the processor the event occurred, re-initiating an instruction which depended on data from logic units (active regions) near the cosmic ray detector 102, rolling-back an instruction, initiating an interrupt to halt an instruction, refreshing cache memory or other memories, etc. In one embodiment, logic unit 106 informs one or more other transistors 103 to turn on/off according to the output of the amplifier 105.

The profile of the charge from a cosmic ray event or the signal shape of a cosmic ray charged particle cloud is quite unique. In one embodiment, a matched filter (not shown) is coupled to the output of the amplifier 105 to detect the cosmic ray event. In such an embodiment, the output of the matched filter is received by the logic unit 106.

In one embodiment, logic unit 106 may find it sufficient to record the fact that a certain portion of the chip 100 was subject to error from a cosmic ray event. In one embodiment, logic unit 106 initiates speculative execution, where the speculation is that no soft errors happened. In one embodiment, a bit value is stored by the logic unit 106 that records a cosmic ray event in the vicinity of a logical processing unit. In one embodiment, the value of the stored bit may initiate recovery. In one embodiment, recovery could consist of restarting a calculation from a previous set point, using only results from undisturbed processing cores (e.g., in a multi-core processor, where each core is like an independent processor), or perhaps running a detailed memory diagnostic to catch and repair damaged bits. In such an embodiment, a large expense in redundant logic and memory can be avoided without loss of reliability.

In one embodiment, processor or chip 100 further comprises a counter (not shown) to count a number of times a region of the chip 100 has received cosmic rays. In one embodiment, when a count value of the counter reaches a predefined (or predetermined) or programmable value (e.g., 1000), then logic unit 106 (or any other logic unit) may indicate to a user, an operating system, or any appropriate logic unit, that a particular region of the chip 100 has received a threshold number of cosmic rays. In one embodiment, when the number of cosmic ray hits is above or equal to the predetermined (or programmable) threshold, then the region of the chip 10 that received those number of cosmic rays is declared permanently damaged area and so the logic of that region is avoided (or not used at all) by other logic units because that region of the circuit cannot be considered reliable.

In one embodiment, when the counter reaches a predefined or programmable count value, the chip 100 initiates a self-test operation that involves the logic of the region that received the threshold number of cosmic ray events. The examples of self-test operation include: running or executing a series of instructions through the logic of interest and comparing the outputs of that logic to a known-good pattern; running or executing a series of instructions through the logic of interest and creating a Cyclic Redundancy Check (CRC) sum and comparing the CRC sum with the known-good sum, etc. In other embodiment, other methods for creating high coverage test vectors, particularly for small logic units, may be used for self-testing.

Figure 2:
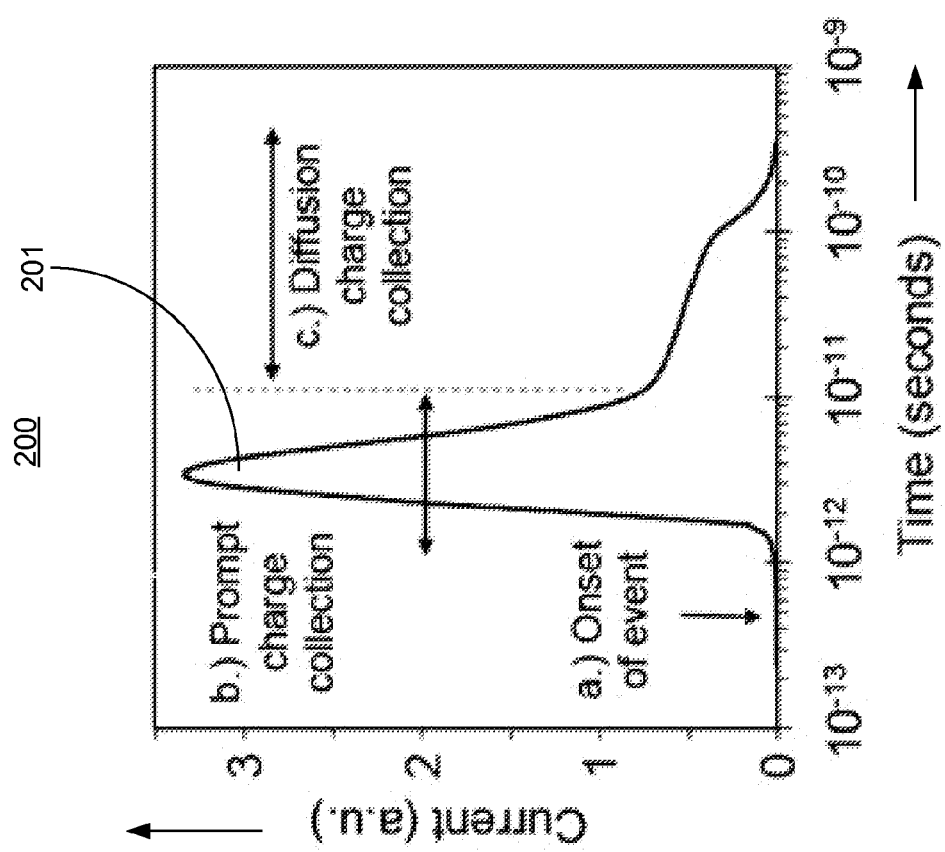
FIG. 2 illustrates a current/charge profile to be detected by the cosmic ray detector, according to one embodiment of the disclosure.

FIG. 2 illustrates a current/charge profile 200 to be detected by the cosmic ray detector 102, according to one embodiment of the disclosure. It is pointed out those elements of FIG. 2 having the same reference numbers (or names) as the elements of any other figure can operate or function in any manner similar to that described, but are not limited to such.

The x-axis of the profile is time in seconds and the y-axis is current in micro amperes ($\mu A$). The profile 200 illustrates three regions—(a), (b), and (c). Region (a) indicates nearly zero current at the onset of a cosmic ray event i.e., a cosmic ray hitting the substrate 101. Region (b) (also called 201) illustrates the current/charge profile caused by charge collection upon the cosmic ray event. Region (c) illustrates the decaying of charge as shown by diffusion charge collection. As discussed herein, the cosmic ray detector 102 can be designed to detect the current/charge 201 within the profile 300.

A cosmic ray that causes soft errors creates ionizing debris with tracks some microns long. The net energy released is several million electron volts (eV). This sudden energy release produces physical signals that may be used for detection of a soft error event. These signals include: 1) an acoustic pulse, 2) direct electrical detection of the charge flux, and 3) IR photons from electron-hole recombination.

Silicon is an indirect-gap semiconductor, hence minimal excitation of an electron-hole pair ($E_g$=1.1 eV) requires a phonon as part of a three-body collision to conserve momentum. Under very fast, strong Coulomb excitation, electron-hole pairs receive enough energy to move beyond the lowest band gap to a band gap location where there is no extra momentum requirement. This is the direct band gap whose energy, $E_T 1$, is 3.6 eV at 273K. Holes and electrons at the direct band gap then radiate phonons, losing energy and gaining momentum to move towards the lowest band gap state. One parameter is the radius of the electron-hole cloud around the carbon nucleus' track. The source of the ionizing power is the time-changing Coulomb field of the moving nucleus—Fourier components of the electric field act as virtual photons. The further out an observer sits from the nucleus' track the slower the Coulomb field changes direction and the lower the frequency of the virtual photons.

For example, for 93° A radius there are no components in the time-dependence of the electric field above 3.6 eV in frequency. In one embodiment, the entire track can be modeled as a tube 100° A in radius by 3 microns long, full of 3.6 eV energy electron-hole pairs—created in one picosecond (ps). Once the electron-hole plasma is created the individual particles will rapidly diffuse out from the initial track.

In one embodiment, cosmic ray detectors (e.g., 102 and the detector adjacent to it) comprise an array of thin wires that detect the high mobility electrons flowing in the conduction band of the chip (or substrate 101). In one embodiment, the wires are positioned close enough to sample secondary electrons from a cosmic ray to generate a practical detector.

In one embodiment, a metal wire (part of the detector 102) in contact with a semiconductor produces a Schottky barrier. In one embodiment, region 102 is a region depleted of mobile carriers and acts as the spacing layer for a cylindrical capacitor. In one embodiment, a 0.1 μm radius wire will have a capacitance of $8\times10^{-16}$ farads/μm. In one embodiment, an embedded wire (of the cosmic ray detector 102) in a volume of silicon is shielded by its Schottky barrier and captures electrons that penetrate the barrier. An embedded wire that fully threads a volume of silicon may have an effective capture volume equal to its Schottky barrier cross section times its length. In one embodiment, the array of wires (of the cosmic ray detector 102) have a capture ratio of $R_{capture}=\pi x^2_b/\text{wire\_spacing}^2$, where $R_{capture}$ is the fraction of cosmic ray charges that will be captured by the array of wires, and where $x_b$ is the Schottky barrier width.

The secondary electrons from the initial fireball continue to diffuse away from the cosmic ray track without significant recombination losses. In one embodiment, an array of wires capture $Q_{pulse}=R_{capture}\ 1\times10^6$ e [Coulombs], where $Q_{pulse}$ is the total cosmic ray charge captured into the array of wires.

For example, for 30 μm wire spacing, a captured charge of $5\times10^{-17}$ Coulombs is detected in the Schottky barriers. In one embodiment, 100 μm of total wire length is connected together to form the cosmic ray detector 102. In such an embodiment, the captured charge will pump up a net capacitance of $8\times10^{-14}$ farads, producing 600 μV of signal at the contact 102 with a typical time scale of 10 ps. In one embodiment, cosmic ray detector 102 has wires with pickup elements (not shown) connected together and brought to the input of a high speed amplifier 105. In one embodiment, amplifier 105 is a differential amplifier. In one embodiment, one or more transistors of the amplifier 105 have an equivalent input noise voltage of 1 nV/sqrt(Hertz). In other embodiments, the transistors of amplifier 105 may have different input noise voltage.

In one embodiment, an array of vertical wires connected over 1000's of square microns to a single electronic circuit (e.g., amplifier 105) detects probable soft error events. In one embodiment, amplifier 105 is designed to detect the expected shape of the voltage pulse received by the wire detector (of the cosmic ray detector 102). For example, a leading edge of 1ops rise-time error function is used to model the initial expansion of the charge tube. This is a soft form of a step function and models well the expected Gaussian statistics of diffusion and relaxation. As time progresses diffusion of charge leads to an increase in the volume of the charge cloud with a corresponding reduction in the density of electrons near the detector wire.

Figure 3:
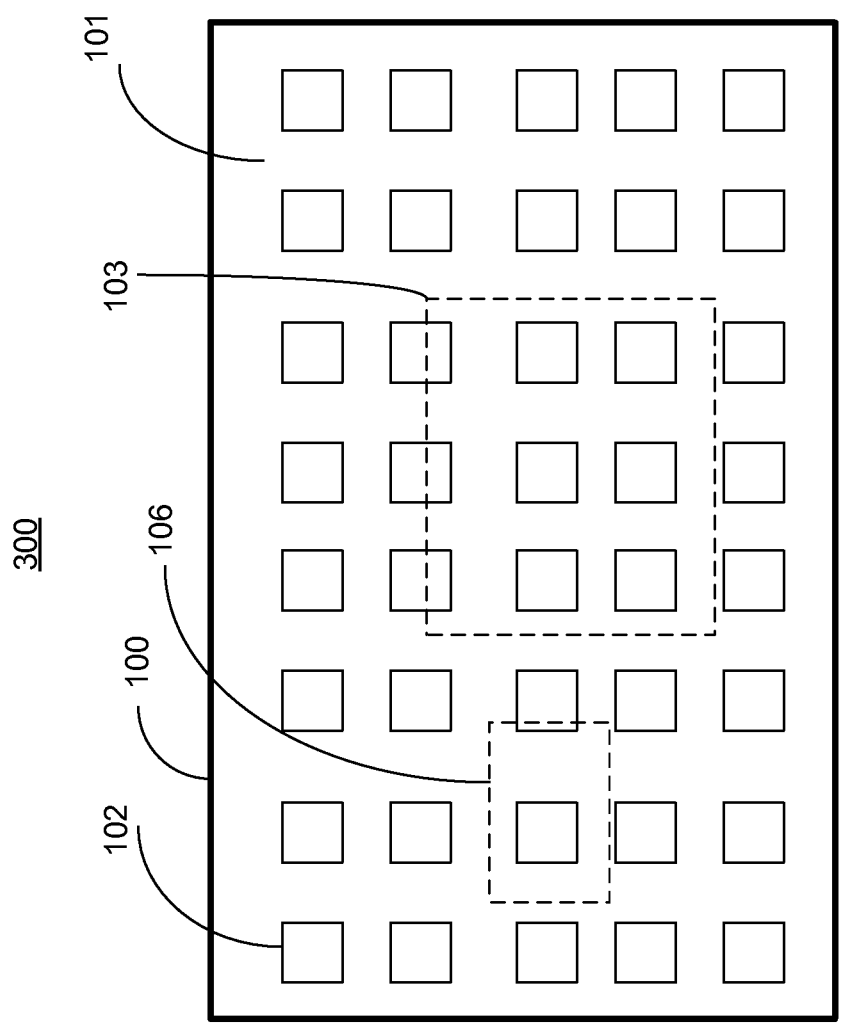
FIG. 3 is a top view of a processor with substrate having array of embedded cosmic ray detectors and other logics to compensate for cosmic ray events, according to one embodiment of the disclosure.

FIG. 3 is a top view 300 of a substrate 101 with array of embedded cosmic ray detectors and other logics to compensate for cosmic ray events, according to one embodiment of the disclosure. It is pointed out those elements of FIG. 3 having the same reference numbers (or names) as the elements of any other figure can operate or function in any manner similar to that described, but are not limited to such.

In one embodiment, cosmic ray detectors 102 are positioned next to one another forming an array of cosmic ray detectors 102. In one embodiment, amplifier 105 is coupled to outputs of the array of cosmic ray detectors 102 embedded in the substrate 101, the output of the amplifier 105 used for reducing error in the plurality of logic units. In one embodiment, the cosmic ray detectors are positioned within a square micron of other cosmic ray detectors in the array of cosmic ray detectors.

One reason for having the array of cosmic ray detectors 102 is to detect cosmic ray events for various regions of the processor. In one embodiment, certain logic sections of the processor that received a cosmic ray may be reset instead of resetting the entire processor. In one embodiment, a section or bank of a cache of a processor, having the cosmic ray detectors 102, which received the cosmic rays may be refreshed without spending the power to refresh the entire cache. In other embodiments, the entire cache may be refreshed when a section of a cache receives a cosmic ray event.

While the embodiments herein describe an array of wires for detecting cosmic ray event followed by a single amplifier to generate a signal indicating a cosmic ray event, other modifications are also within the scope of the embodiments. In one embodiment, multiple amplifiers are paired with a group of wires for many detector wires detecting cosmic ray event. For example, a single transistor may be used to cover 1,000's of square microns of chip area with several groups of wires while in other embodiments many transistors may be used to better localize the cosmic ray strike region on the chip.

Figure 4:
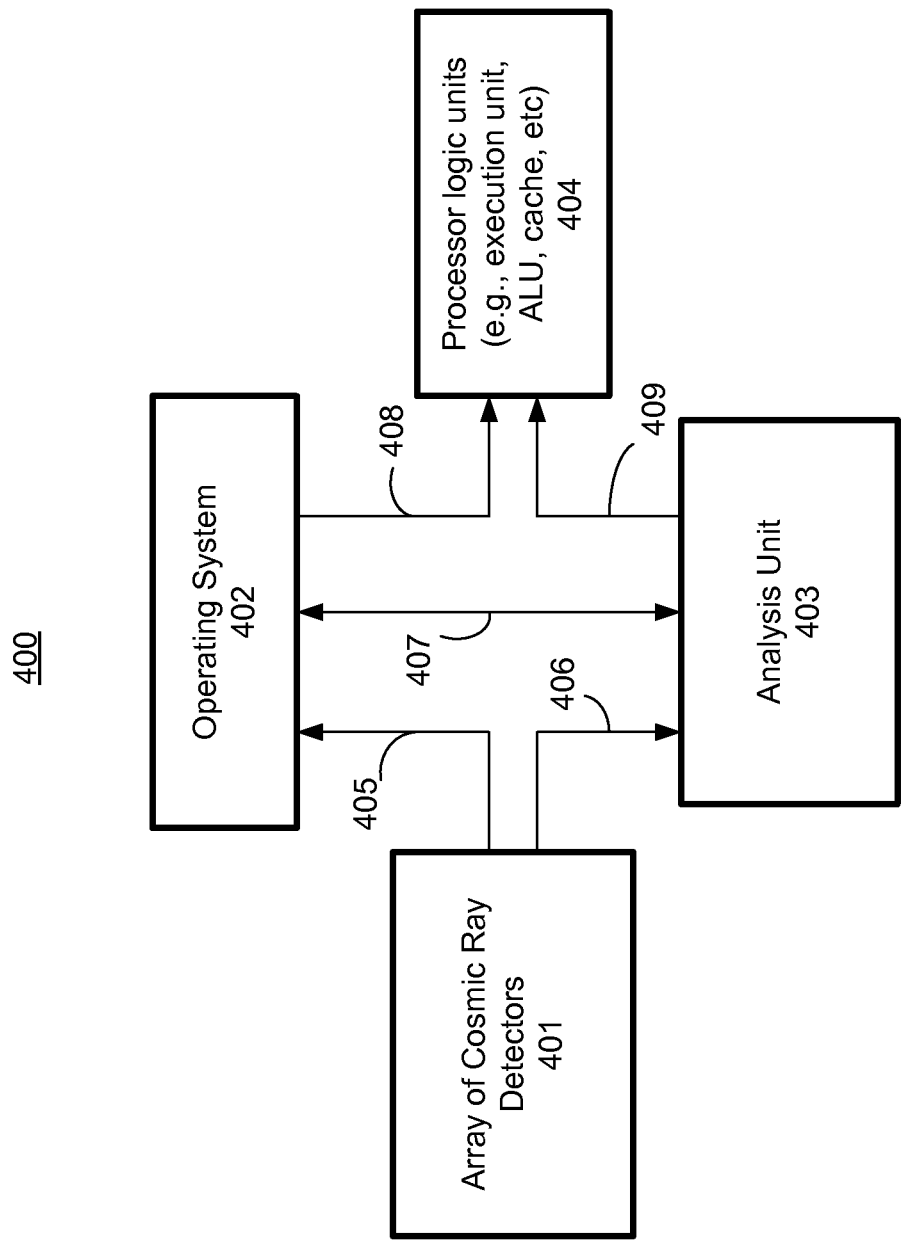
FIG. 4 is functional view of a system having logic units to compensate for cosmic ray events, according to one embodiment of the disclosure.

FIG. 4 is functional view of a recovery system 400 having logic units to compensate for cosmic ray events, according to one embodiment of the disclosure. It is pointed out those elements of FIG. 4 having the same reference numbers (or names) as the elements of any other figure can operate or function in any manner similar to that described, but are not limited to such. In one embodiment, the recovery system 400 comprises one or more of an array of cosmic ray detectors 401, operating system 402, analysis unit 403, and processor logic units 404.

In one embodiment, output 406 of amplifier 105 is received by the analysis unit 403 to determine which region of the processor received the cosmic ray. In one embodiment, analysis unit 403 instructs various affected logic units 404 (e.g., arithmetic logic unit (ALU), cache, execution unit, etc) of the processor to begin the recovery process.

For example, analysis unit 403 may instruct the cache via signal 409 because the array of cosmic ray detectors 401 embedded in the cache detected a cosmic ray event. In one embodiment, analysis unit 403 communicates with the operating system 402 via signal 407 to determine what steps should be taken to recover any data corrupted by the cosmic ray event.

In one embodiment, operating system 402 receives the information via signal 405 from the array the cosmic ray detectors 401 to determine what instructions to send to the analysis unit 403 (via signal 407) and/or the processor logic units 404 (via signal 408) to initiate recovery.

For example, in one embodiment, operating system 402 instructs the processor logic units to discard the results from a previously executed instruction and to re-execute the instruction. Examples of operating system 402 include operating systems designed and sold by Apple®, Google®, Microsoft®, RedHat®, etc. In one embodiment, operating system 402 determines that even with the cosmic ray event the data value remains the same and so it allows the execution unit to continue with its instruction execution without asking the execution unit to re-execute the instruction.

In one embodiment, array of cosmic ray detectors 401 and associated logic 106 detect a cosmic ray event within a nanosecond so that the hardware can directly re-run any calculation without the intervention from the operating system 402 or software.

Figure 5:
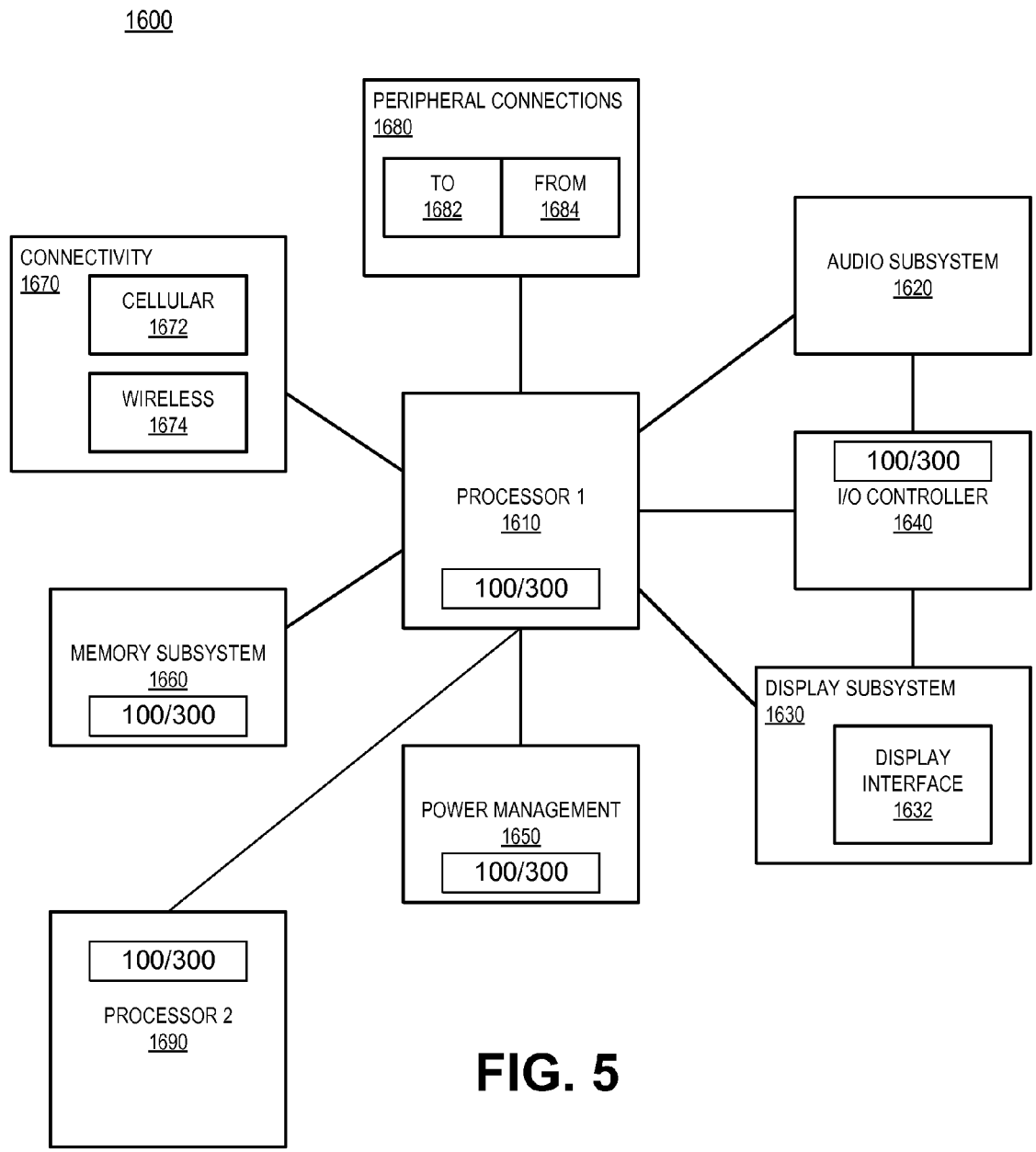
FIG. 5 is a system-level diagram of a smart device comprising a processor with cosmic ray detectors, according to one embodiment of the disclosure.

FIG. 5 is a system-level diagram of a smart device 1600 comprising a processor with cosmic ray detectors, according to one embodiment of the disclosure. It is pointed out those elements of FIG. 5 having the same reference numbers (or names) as the elements of any other figure can operate or function in any manner similar to that described, but are not limited to such. FIG. 5 also illustrates a block diagram of an embodiment of a mobile device in which flat surface interface connectors could be used. In one embodiment, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in device 1600.

In one embodiment, computing device 1600 includes a first processor 1610 with the array of cosmic ray detectors (as shown in FIG. 3) and a second processor 1690 with the array of cosmic ray detectors (as shown in FIG. 3), according to the embodiments discussed herein. Other blocks/units shown in FIG. 5 may also include the array of cosmic ray detectors (as shown in FIG. 3). The various embodiments of the present disclosure may also comprise a network interface within 1670 such as a wireless interface so that a system embodiment may be incorporated into a wireless device, for example, cell phone or personal digital assistant.

In one embodiment, processor 1610 can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In one embodiment, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 1600, or connected to the computing device 1600. In one embodiment, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to device 1600 through which a user might interact with the system. For example, devices that can be attached to the computing device 1600 might include microphone devices, speaker or stereo systems, video systems or other display device, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem includes a touch screen, the display device also acts as an input device, which can be at least partially managed by I/O controller 1640. There can also be additional buttons or switches on the computing device 1600 to provide I/O functions managed by I/O controller 1640.

In one embodiment, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In one embodiment, computing device 1600 includes power management 1650 that manages battery power usage, charging of the battery, and features related to power saving operation. Memory subsystem 1660 includes memory devices for storing information in device 1600. Memory can include nonvolatile (state does not change if power to the memory device is interrupted) and/or volatile (state is indeterminate if power to the memory device is interrupted) memory devices. Memory 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, or other type of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity 1674 refers to wireless connectivity that is not cellular, and can include personal area networks (such as Bluetooth, Near Field, etc), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on device 1600. Additionally, a docking connector can allow device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description.

For example, in one embodiment the cosmic ray detectors 102 can be implemented as acoustic detectors. Once the initial electron-hole tube is created, thermalization proceeds by emitting high-energy phonons from individual electron and holes. As phonons have 100 meV or less energy, many phonons are to be emitted per electron or hole. Phonon emission continues until the electron or hole relaxes to the edge of its conduction band. At this point reduction of energy requires a recombination event which can be very slow in silicon—usually mediated through an impurity as per the Schockley-Hall-Read process. For electron-holes near insulators, doped regions, metal layers, etc., faster recombination happens. In one embodiment, an alternative to silicon recombination is the use of embedded III-V materials which as direct semiconductors have fast photon emission. Much of the initial ionization energy is radiated into high-energy phonons in a few picoseconds.

The highest energy phonons (near the Debye temperature) have their mean free path limited by Umklapp scattering. Those phonons below ½ of the Debye temperature are not limited by Umklapp scattering. However, phonons interact strongly with each other through the crystal's anharmonic coupling and frequently combine to form high energy phonons. These then are limited by Umklapp scattering. In the case of cryogenic temperatures, direct ballistic transport for all the phonons occur and the high energy phonons can be detected at large distances, e.g., using phonon-assisted tunneling according to one embodiment. Umklapp scattering and normal phonon-phonon scattering at room temperature lead to a mean free path length of 100° A, hence the phonon gas equilibrates within the original electron-hole tube. The speed of sound in silicon determines that a typical crossing time for a phonon between collisions will be a picosecond. These considerations show that a nuclear collision may result in an expanding, cooling tube which over 10 ps grows to a micron-scale volume of thermalized phonons, electrons, and holes.

After equilibration the phonon gas is modeled as macroscopic heating of the silicon in the track tube—by 0.02 K. This is based on a tube volume of $2 \times 10^{-17}$ $m^3$, the resulting mass, and the heat capacity of silicon. Heating causes strain, with a predicted value of $6 \times 10^{-8}$, which in turn raises the internal pressure in the heated tube by $3 \times 10$ nt-$m^{-2}$. The energy increase from the pressure rise is $\delta P$ integrated over the tube volume—$6 \times 10^{-21}$ joules.

This constitutes the energy of a piston driving sound waves out from the cosmic ray track. In one embodiment, $9 \times 10^{-9}$ of the track energy is converted into sound energy by this heated piston of silicon. In one embodiment, this fraction of the track energy is converted into a coherent pressure wave and a sensitive on-chip cosmic ray detector can measure these sound waves or phonons at room temperature. In one embodiment, direct phonon is used in cryogenic systems.

In another embodiment, cosmic ray detectors 102 can be implemented as optical detectors. In such an embodiment, cosmic ray detection is performed by embedding III-V quantum wells inside the silicon chip 100. As low band gap materials and as direct semiconductors, III-V quantum wells rapidly convert itinerant charges that enter them into IR (infrared) photons below the band gap of silicon. At this low photon energy IR energy can propagate for long distances with little attenuation and then can be efficiently converted back into electrical energy by a III-V quantum well receiver circuit. In one embodiment, the use of III-V quantum wells may be attractive for many other device uses as they have much higher mobility than pure silicon transistors. One non-limiting advantage of optical detection is that small quantum dots or wells can be spread around vulnerable regions of a chip with a minimum of wires and the signals are not attenuated by large capacitive loads in detector wires. As before the capture efficiency of a III-V quantum well is basically the volume of the well to the volume of silicon around all the wells. Assuming a 0.1 μm radius device with a 1 μm well to well spacing, a capture efficiency of $4 \times 10^{-3}$ is achieved according to one embodiment. Thus about 4,000 electrons will be captured from a typical cosmic ray track.

With a $1/r^2$ attenuation and a photon wavelength of 1 μm (receiver capture area of $\lambda^2$) then at a distance of 10 μm, 3 photons per pulse can be expected to be detected by a receiving III-V quantum well. In one embodiment, system gain is increased by adding capture wires to the quantum wells. If all the active transistors become III-V devices then any cosmic ray disturb will also produce copious IR photons. In one embodiment, electrical energy is used to amplify the optical transmission from a cosmic-ray triggered optical quantum well device. In such an embodiment, the $1/r^2$ attenuation suffered is overcome by unpowered transmitting optical quantum wells.

In another embodiment, charge-based cosmic ray detector 102 can be used in three-dimensional (3D) nanoscale technology, for example, bio-based components, quantum dots, mechanical nano devices, etc. In such embodiments, the conduction band of these technologies will transport excited charges away from the track and thus allowing detection of cosmic ray event.

The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented i.e., such specifics should be well within purview of one skilled in the art. Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

In one embodiment, the cosmic ray detectors discussed herein could be wirelessly coupled to the chips. If the term "first circuitry" (or similar term) is used in the claims, it does not necessarily apply that there is secondary circuitry, although there might be.

The following examples pertain to further embodiments. Specifics in the examples may be used anywhere in one or more embodiments. All optional features of the apparatus described herein may also be implemented with respect to a method or process.

For example, in one embodiment, a chip comprises: a substrate; a logic unit forming an active circuit on the substrate; and a cosmic ray detector embedded in the substrate, the cosmic ray detector to detect a cosmic ray and to generate a signal indicating detection of the cosmic ray, the signal provided by a contact in the cosmic ray detector, the signal for reducing error in the logic unit. In one embodiment, the chip further comprises a wire coupled to the contact. In one embodiment, the chip further comprises another cosmic ray detector embedded in the substrate, the other cosmic ray detector positioned within a square micron of the cosmic ray detector. In one embodiment, the cosmic ray detector comprises conducting wires to collect charge caused by the cosmic ray. In one embodiment, the chip further comprises a counter to count a number of times a region of the chip has received cosmic rays. In one embodiment, the cosmic ray detector is part of at least one of: bio-based component, quantum dot, or mechanical nano device.

In one embodiment, the chip further comprises a sense amplifier coupled to the cosmic ray detector and the other cosmic ray detector, and to generate a sense signal indicating a cosmic event. In one embodiment, the chip further a sense amplifier to detect the signal generated by the cosmic ray detector, and to generate a sense signal. In one embodiment, the chip further comprises a logic unit to roll-back an executing or executed instruction according to a level of the sense signal. In one embodiment, the chip further comprises a logic unit to generate an interrupt in response to a level of the sense signal. In one embodiment, the chip further comprises a logic unit to initiate and determine according to the sense signal, whether to address at least one of: soft errors in the chip; hard errors in the chip; or device aging and variation in the chip.

In another example, a chip comprises: a substrate; a plurality of logic units forming active circuits on the substrate; an array of cosmic ray detectors embedded in the substrate to detect a cosmic ray and to generate one or more signals indicating detection of the cosmic ray; and a sense amplifier coupled to outputs of the array of cosmic ray detectors embedded in the substrate, the output of the sense amplifier for reducing error in the plurality of logic units.

In one embodiment, each cosmic ray detector of the array of cosmic ray detectors is positioned close enough to detect a cloud of charged particles from the cosmic ray. In one embodiment, each cosmic ray detector of the array of cosmic ray detectors is positioned within a square micron from one another. In one embodiment, the array of cosmic ray detectors embedded in the substrate comprise metal or conducting elements embedded in the substrate, wherein each of the metal or conducting elements have a corresponding contact to provide an interface for a signal indicating detection of the cosmic ray.

In one embodiment, a system comprises a memory unit; a processor, coupled to the memory unit, the processor according to the chip discussed herein; and a wireless interface for communicatively coupling the processor with another device. In one embodiment, the system further comprises a display unit.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

I claim:

1. A semiconductor chip comprising:
   a substrate;
   a cosmic ray detector at least partially embedded in the substrate, the cosmic ray detector comprised of an array of multiple wires disposed on the substrate and coupled to a single sense amplifier, the cosmic ray detector to generate a signal indicating detection of a cosmic ray, the signal being representative of charge generated from the cosmic ray,
   a logic unit coupled downstream from the sense amplifier to reduce error in the semiconductor chip.

2. The chip of claim 1 wherein the one or more wires are disposed over 1000s of square microns.

3. The chip of claim 1 wherein the sense amplifier is to generate a sense signal.

4. The chip of claim 3 wherein the logic unit is to roll-back an executing or executed instruction according to a level of the sense signal.

5. The chip of claim 3 wherein the logic unit is to generate an interrupt in response to a level of the sense signal.

6. The chip of claim 3 wherein the logic unit is to initiate and determine according to the sense signal, whether to address at least one of:
   soft errors in the chip;
   hard errors in the chip; or device aging and variation in the chip.

7. The chip of claim 1 wherein the logic unit further comprises a counter to count a number of times a region of the chip has received cosmic rays.

8. A chip comprising:
a substrate;
active circuits on the substrate;
an array of wires each coupled to a single sense amplifier formed on the substrate to detect a cosmic ray and to generate one or more signals indicating detection of the cosmic ray; and
a logic unit to reduce error in the active circuits.

9. The chip of claim 8, wherein the wires are positioned close enough to detect a cloud of charged particles from the cosmic ray.

10. The chip of claim 8, wherein the array of wires is positioned over 1000s of square microns.

11. A system comprising:
a memory unit;
a processor, coupled to the memory unit, the processor comprises:
a substrate;
an active circuit on the substrate; and
a cosmic ray detector at least partially embedded in the substrate, the cosmic ray detector comprised of an array of multiple wires disposed on the substrate and coupled to a single sense amplifier, the cosmic ray detector to generate a signal indicating detection of a cosmic ray, the signal being representative of charge generated from the cosmic ray,
a logic unit coupled downstream from the sense amplifier to reduce error in the active circuit; and,
a wireless interface for communicatively coupling the system with another device.

12. The system of claim 11 further comprising a display unit.

13. The system of claim 11 wherein the logic unit is to roll-back an executing or executed instruction according to a level of the sense signal.

14. The system of claim 11, wherein the wires are positioned close enough to detect a cloud of charged particles from the cosmic ray.

* * * * *